United States Patent
Nakamura et al.

(10) Patent No.: US 8,209,827 B2
(45) Date of Patent: Jul. 3, 2012

(54) METHOD OF MANUFACTURING A PIEZOELECTRIC ELEMENT

(75) Inventors: Shigenobu Nakamura, Kirishima (JP); Hiroyuki Masuyama, Kirishima (JP)

(73) Assignee: Kyocera Corporation, Kyoto (JP)

( * ) Notice: Subject to any disclaimer, the term of this patent is extended or adjusted under 35 U.S.C. 154(b) by 735 days.

(21) Appl. No.: 12/357,252

(22) Filed: Jan. 21, 2009

(65) Prior Publication Data

US 2009/0133238 A1 May 28, 2009

Related U.S. Application Data

(62) Division of application No. 11/569,656, filed as application No. PCT/JP2005/005229 on Mar. 23, 2005, now Pat. No. 7,498,727.

(30) Foreign Application Priority Data

May 27, 2004 (JP) .................................. 2004-158452

(51) Int. Cl.
 H01L 41/047 (2006.01)
 B24B 1/04 (2006.01)
(52) U.S. Cl. ............. 29/25.35; 29/846; 451/36; 451/40
(58) Field of Classification Search .................. 29/25.35, 29/25.41, 830, 846, 412, 417, 621; 451/36, 451/38, 40; 310/328, 366; 428/210
 See application file for complete search history.

(56) References Cited

U.S. PATENT DOCUMENTS

| | | | | |
|---|---|---|---|---|
| 5,252,883 A | 10/1993 | Kondo | ........................... | 310/328 |
| 5,389,851 A | 2/1995 | Kimura et al. | ................ | 310/340 |
| 5,406,164 A | 4/1995 | Okawa et al. | ................ | 310/366 |
| 5,607,535 A * | 3/1997 | Tsukada et al. | ........ | 29/25.35 X |
| 5,876,841 A * | 3/1999 | Banba et al. | ............. | 428/210 X |
| 6,153,256 A * | 11/2000 | Kambara et al. | ............ | 29/621 X |
| 6,483,227 B2 | 11/2002 | Murai et al. | .................... | 310/328 |
| 7,059,940 B2 * | 6/2006 | Seo et al. | ..................... | 451/38 X |
| 7,268,471 B2 | 9/2007 | Riemer | ......................... | 310/365 |
| 7,276,841 B2 | 10/2007 | Takaoka et al. | ............... | 310/363 |
| 2004/0178701 A1 | 9/2004 | Sato et al. | ..................... | 310/328 |
| 2006/0087204 A1 | 4/2006 | Shindo et al. | ................. | 310/358 |
| 2006/0119219 A1 | 6/2006 | Kadotani et al. | ............. | 310/328 |
| 2006/0138908 A1 | 6/2006 | Iwase et al. | .................... | 310/366 |

FOREIGN PATENT DOCUMENTS

EP 0 469 473 B1 4/1996

(Continued)

OTHER PUBLICATIONS

Machine Language Translation of JP 2000-297273.*

(Continued)

*Primary Examiner* — A. Dexter Tugbang
(74) *Attorney, Agent, or Firm* — DLA Piper LLP (US)

(57) ABSTRACT

A method of manufacturing a multi-layer piezoelectric element is disclosed. The method forms a stack from at least one piezoelectric layer and a plurality of internal electrodes stacked one on another; grinds at least two side faces of the stack, thereby forming one or more cracks on the two side faces; and applies an electrically conductive paste containing 1% by weight or more glass onto the two side faces and firing the stack at such a temperature that is higher than the softening point of the glass and causes the electrically conductive paste that has been applied to shrink by 10% or more in the direction of thickness, thereby forming the external electrodes.

8 Claims, 6 Drawing Sheets

FOREIGN PATENT DOCUMENTS

| | | |
|---|---|---|
| JP | 03087079 A | 4/1991 |
| JP | 04-085976 | 3/1992 |
| JP | 04-096385 | 3/1992 |
| JP | 06-120579 | 4/1994 |
| JP | 06-151994 | 5/1994 |
| jp | 06-252469 | 9/1994 |
| JP | 07-312447 | 11/1995 |
| JP | 09-270540 | 10/1997 |
| JP | 2000297273 A * | 10/2000 |
| JP | 2003-017768 | 1/2003 |
| JP | 2005-067069 | 3/2005 |

OTHER PUBLICATIONS

Dean et al, "New Fine-Beam, Abrasive Water Jet Technology Enables Photonic and Small Device Singulation", Chip Scale Review, Aug./Sep. 2002, pp. 43-47.*

Japanese language office action dated Feb. 15, 2011 and its English language translation for corresponding Japanese application 2004158452.

* cited by examiner

METHOD OF MANUFACTURING A PIEZOELECTRIC ELEMENT

CROSS-REFERENCE TO RELATED APPLICATIONS

This application is a divisional of application Ser. No. 11/569,656 filed Nov. 27, 2006, which is a national stage of international application No. PCT/JP2005/005229 filed Mar. 23, 2005, the entire contents of both applications are incorporated herein by reference. This application also claims the benefit of priority under 35 USC 119 of Japanese Patent Application No. 2004-158452 filed May 27, 2004, the entire content of which is incorporated herein by reference.

TECHNICAL FIELD

The present invention relates to a multi-layer piezoelectric element, a method for manufacturing the same and an injection apparatus, for example, piezoelectric transducer, fuel injection apparatus of automobile engine, and multi-layer piezoelectric actuator used as a drive unit in precision positioning device or vibration preventing device or the like for an optical apparatus.

BACKGROUND ART

Multi-layer piezoelectric actuators constituted from piezoelectric layers and internal electrodes stacked alternately one on another have been known as an example of the multi-layer piezoelectric element. The multi-layer piezoelectric actuators can be divided into two categories: fired-at-once type and stacked type that comprises piezoelectric porcelain and internal electrode sheet stacked alternately one on another. When the requirements to reduce the operating voltage and the manufacturing cost are taken into consideration, the multi-layer piezoelectric actuator of fired-at-once type has been recognized to be more advantageous for the reason of smaller layer thickness.

FIG. 7 shows a multi-layer piezoelectric actuator of the prior art. This multi-layer piezoelectric actuator comprises a stack 53 formed by stacking piezoelectric layers 51 and internal electrodes 52 one on another. Placed on both end faces of the stack in the direction of stacking are inactive layers 55. The internal electrodes 52 are formed so that one end thereof is exposed on the side face of the stack 53 on the right hand side in one layer and on the left hand side in the next layer, and an external electrode 70 is formed on the side face of the stack 53 where the end of the internal electrode 52 is exposed. The other end of the internal electrode 52 is covered by an insulating material 61 so as to be isolated from the external electrode 70.

The multi-layer piezoelectric actuator of fired-at-once type has been manufactured by stacking a predetermined number of green ceramic sheets, which are formed from a calcined powder of piezoelectric material and an organic binder, with an internal electrode paste made by mixing a silver-palladium powder and a binder being printed on the ceramic green sheets, thereby forming a green compact from the stack, and firing the green compact after removing the organic materials by heating to a predetermined temperature.

Patent Document 1: Japanese Unexamined Patent Publication (Kokai) No. 9-270540

DISCLOSURE OF THE INVENTION

The multi-layer piezoelectric actuator of the prior art has such problems that, when operated continuously over a long period of time under a high electric field and a high pressure, contact failure occurs in the junction between the external electrode and the internal electrode, thus shutting off the current supply to part of the piezoelectric layers and resulting in alteration of the displacement characteristic during operation.

In recent years, in order to achieve a large amount of displacement under a high pressure with a multi-layer piezoelectric actuator of smaller size, it is in practice to make continuous operation over a long period of time with a higher electric field applied. However, the external electrode and the internal electrode cannot be bonded together sufficiently simply by applying and baking the electrically conductive paste on the side face of the stack, and the external electrode may peel off the side face of the stack and the end of the internal electrode when operated continuously over a long period of time under a high electric field, thus resulting in contact failure and deterioration in the displacement characteristic.

Accordingly, an object of the present invention is to provide a low cost multi-layer piezoelectric element which has high durability wherein the internal electrodes and the external electrodes do not break even when operated continuously over a long period of time under high electric field and high pressure.

In order to achieve the object described above, the multi-layer piezoelectric element according to the present invention comprises a stack formed by stacking at least one piezoelectric layer and a plurality of internal electrodes consisting of first and second internal electrodes one on another, and external electrodes formed on two side faces of the stack with one of which being connected to the first internal electrode and the other external electrode being connected to the second internal electrode, wherein the external electrodes contain an electrically conductive material and glass, the side face of the stack whereon the external electrode is formed has cleft which has a wedge which contains glass formed therein, and the cleft is filled with the glass contained in the wedge and glass contained in the external electrode.

In the multi-layer piezoelectric element of the present invention, it is preferable that the cleft joins with the internal electrode.

In the multi-layer piezoelectric element of the present invention, it is also preferable that the glass contained in the wedge and the glass contained in the external electrode are constituted from the same component.

In the multi-layer piezoelectric element of the present invention, it is also preferable that maximum depth of the cleft in a direction perpendicular to the stacking direction of the stack is 100 µm or less.

In the multi-layer piezoelectric element of the present invention, it is also preferable that maximum width of the cleft is 15 µm or less.

In the multi-layer piezoelectric element of the present invention, it is also preferable that filling ratio of glass in the cleft is 70% or more.

In the multi-layer piezoelectric element of the present invention, it is also preferable that a glass layer is formed between the side face and the external electrode.

A method for manufacturing a multi-layer piezoelectric element according to the present invention comprises the steps of forming the stack from at least one piezoelectric layer and a plurality of internal electrodes stacked one on another, grinding at least two side faces of the stack, and applying an electrically conductive paste containing 1% by weight or more glass onto the two side faces and firing the stack at such a temperature that is higher than the softening point of the glass and causes the electrically conductive paste that has been applied to shrink by 10% or more in the direction of thickness, thereby forming the external electrodes.

In the method for manufacturing a multi-layer piezoelectric element according to the present invention, it is preferable that the step of forming the stack consists of a step of preparing a green ceramic stack by stacking green ceramic layers containing the material of the piezoelectric layer and electrically conductive layers containing the material of the internal electrode one on another, a step of cutting the green ceramic stack by applying a jet of liquid, which contains an abrasive material comprising ceramic particles of the substantially the same material as the ceramic particles constituting the green ceramic layer, from a jet nozzle to the green ceramic stack, and a step of firing the green ceramic stack which has been cut so as to obtain the stack.

In the method for manufacturing the multi-layer piezoelectric element of the present invention, it is preferable that mean particle size of the abrasive material comprising ceramic particles is in a range from 10 to 500 μm.

In the method for manufacturing the multi-layer piezoelectric element of the present invention, it is also preferable that the liquid constituting the liquid jet has electrical conductivity of 1.0 μS/cm or less.

In the method for manufacturing the multi-layer piezoelectric element of the present invention, it is also preferable to set the discharge pressure for the liquid jet in a range from 100 to 400 MPa.

In the method for manufacturing the multi-layer piezoelectric element of the present invention, it is also preferable to provide the jet nozzles in plurality so as to cut along a plurality of lines at the same time.

In the method for manufacturing the multi-layer piezoelectric element of the present invention, it is also preferable to cut the green ceramic stack on a grinding machine which has drain grooves formed in lattice configuration.

EFFECT OF THE PRESENT INVENTION

The multi-layer piezoelectric element of the present invention having the constitution described above has the cleft having the wedge which contains glass formed in the side face of the stack, and the cleft is filled with the glass that is contained in the external electrode. With this constitution, the glass contained in the wedge and the glass contained in the external electrode join with each other with good affinity thereby increasing the bonding strength between the external electrode and the piezoelectric layer and causing the external electrodes to be bonded firmly onto the side faces of the stack, and therefore such a problem can be prevented from occurring as the external electrodes peel off from the side faces of the stack even when operated over a long period of time under a high electric field.

In the multi-layer piezoelectric element of the present invention, the effect of the wedge can be improved by joining the cleft with the internal electrode.

Also in the multi-layer piezoelectric element of the present invention, when the glass contained in the wedge and the glass contained in the external electrode are constituted from the same components, bonding strength between the external electrode and the piezoelectric layer can be increased further and the cleft can be filled with the glass in the same process where the external electrodes are baked, so that the number of manufacturing processes can be reduced.

When the maximum depth of the cleft in a direction perpendicular to the stacking direction of the stack is 100 μm or less, it becomes easier to fill the cleft with glass, and it is made possible to suppress destruction from developing from the cleft due to stress generated in the piezoelectric layer.

Reliability of the device can be improved by controlling the maximum width of the cleft within 15 μm.

It becomes easier to fill the cleft with glass, and it is made possible to suppress destruction from developing from the cleft through continuous operation of the multi-layer piezoelectric element by controlling the filling ratio of glass in the cleft to 70% or more.

When the filling ratio of glass in the cleft is 70% or more, it is also made possible to suppress destruction from developing from the cleft due to continuous operation of the multi-layer piezoelectric element and further increase the bonding strength between the external electrode and the piezoelectric layer.

In case a glass layer is formed further between the side face and the external electrode, the glass contained in the external electrode and the glass contained in the cleft can be joined firmly with each other via the glass layer, thus making it possible to easily increase the bonding strength between the external electrode and the piezoelectric layer.

Also because the method for manufacturing a multi-layer piezoelectric element of the present invention comprise the steps of grinding at least two side faces of the stack and applying an electrically conductive paste which contains 1% by weight or more glass onto the two side faces and firing the stack at such a temperature that is higher than the softening point of the glass and causes the electrically conductive paste that has been applied to shrink by 10% or more in the direction of thickness thereof thereby to form the external electrodes, it is made possible to form such a cleft, in the step of forming the external electrodes, as the wedge containing the glass is effectively formed by properly growing the cleft starting with microscopic crack formed by grinding in the surface of the stack.

Also in the method for manufacturing a multi-layer piezoelectric element of the present invention, the advantage described below can be obtained from the step of forming the stack which comprises the step of preparing a green ceramic stack by stacking green ceramic layers containing the material of the piezoelectric layer and electrically conductive layers containing the material of the internal electrode one on another, the step of cutting the green ceramic stack by applying a liquid jet, which contains an abrasive material comprising ceramic particles of the substantially same material as the ceramic particles constituting the green ceramic layer, from a jet nozzle to the green ceramic stack, and the step of firing the green ceramic stack which has been cut so as to obtain the stack.

As the green ceramic stack is cut by hitting it with a jet of liquid, which contains an abrasive material comprising ceramic particles of the substantially the same material that constitutes the green ceramic stack, there occurs no crack or peel-off in the ceramic stack that has been fired, even if ceramic particles of the same material as the green ceramic stack enter the cut surface. As a result, microscopic cracks having relatively stable configuration can be formed in the surface of the stack by grinding after firing, so that the cleft can be formed with the depth and shape under control, starting with the microscopic crack. This makes it possible to form the cleft which enables it to effectively form the wedge that contains glass.

Also because abrasive particles of a material having different composition from that of the green ceramic stack do not enter the cut surface of the green ceramic stack, crack and delamination can be suppressed from occurring in the ceramic stack that has been fired, thus making it possible to achieve a large amount of displacement.

Also in the method for manufacturing the multi-layer piezoelectric element of the present invention, use of the abrasive material consisting of ceramic particles of mean particle size controlled within a range from 10 to 500 μm enables high-precision cutting without decrease in the grinding power or decrease in the flow velocity of the liquid jet which is discharged from the jet nozzle.

The liquid jet comprising the liquid having electrical conductivity of 1.0 μS/cm or less makes it possible to suppress cracks and delamination from occurring in the ceramic stack after firing, since much electrolyte does not enter the cut surface of the green ceramic stack as impurity.

Also in the method for manufacturing the multi-layer piezoelectric element of the present invention, controlling the discharge pressure of the liquid jet in the range from 10 to 400 MPa enables it to ensure enough grinding power to cut the green ceramic stack, and make the green ceramic stack having smooth cut surface without being hindered by ground powder generated from the material being ground.

Also in the method for manufacturing the multi-layer piezoelectric element of the present invention, the green ceramic stack can be cut in a shorter time by providing the jet nozzles in plurality so as to cut the green ceramic stack along a plurality of lines at the same time.

In the method for manufacturing the multi-layer piezoelectric element of the present invention, as the green ceramic stack is cut on a grinding machine which has drain grooves formed in lattice configuration, the liquid jet which has been discharged from the jet nozzle and has cut the green ceramic stack is drained through the drain grooves of lattice configuration without bouncing off the grinding machine, so that the liquid jet 7 can be prevented from being deviated from straight flowing direction due to collision of the liquid jet bouncing off and the forward liquid jet.

Figure 1A:
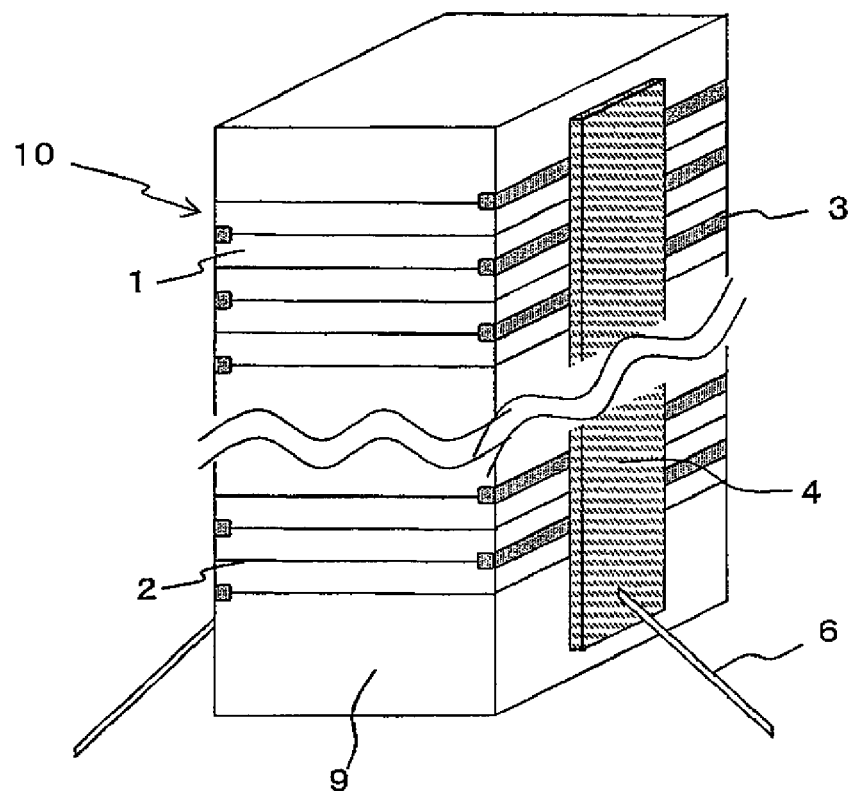
FIG. 1A is a perspective view showing the constitution of the multi-layer piezoelectric actuator according to first embodiment of the present invention.

| Description of Reference Numerals | |
|---|---|
| 1: | piezoelectric layer |
| 1a: | cleft |
| 2: | internal electrode |
| 3: | insulator |
| 4: | external electrode |
| 6: | lead wire |
| 9: | inactive layer |
| 10: | stack |
| 101: | green ceramic stack |
| 102: | drain groove |
| 103: | grinding machine |
| 104: | cut mark |
| 105: | camera |
| 106: | jet nozzle |
| 107: | liquid jet |
| 110: | liquid tank |
| 111: | pressure booster |
| 112: | abrasive tank |
| 113: | pump |

BEST MODE FOR CARRYING OUT THE INVENTION

The multi-layer piezoelectric elements according to embodiments of the present invention will be described below with reference to the accompanying drawings.

First Embodiment

Figure 1B:
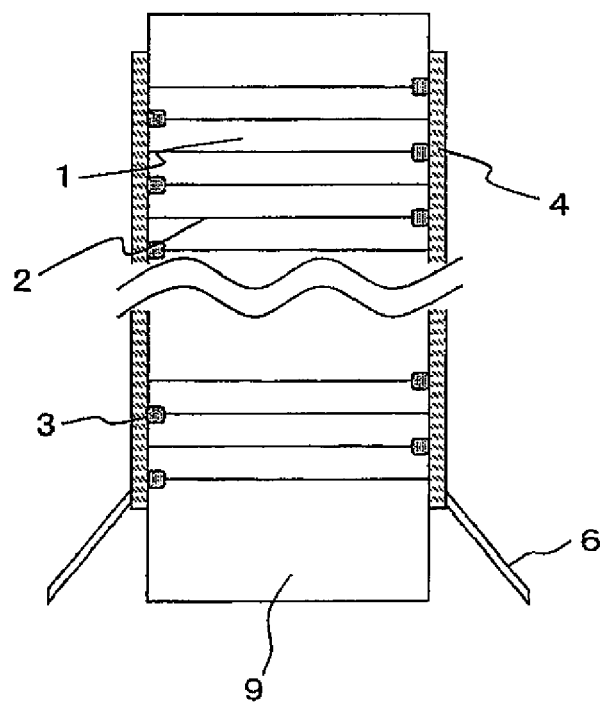
FIG. 1B is a side view showing the constitution of the multi-layer piezoelectric actuator of the first embodiment.

FIG. 1A and FIG. 1B show the constitution of the multi-layer piezoelectric actuator comprising the multi-layer piezoelectric element according to the first embodiment, FIG. 1A being a perspective view and FIG. 1B being a side view thereof.

The multi-layer piezoelectric element according to the first embodiment is constituted by forming the external electrodes 4, from an electrically conductive material containing silver as the main component and glass, on the side faces of the stack 10 having a shape of rectangular prism formed by stacking a plurality of piezoelectric layers 1 and a plurality of internal electrodes 2, as shown in FIG. 1A.

In the first embodiment, the external electrodes 4 are formed so that the end of the internal electrode 2 is covered by an insulating material 3 in every other layer and make electrical connection with the internal electrode 2 which is not covered by the insulating material 3 on the side faces of the stack 10, with a lead wire 6 connected to each of the external electrodes 4.

While the internal electrode 2 is disposed between the piezoelectric layers 1, the internal electrode 2 is formed from a metallic material such as silver-palladium, and a predetermined voltage is applied to the piezoelectric layers 1 via the internal electrode 2, so that the piezoelectric layer 1 undergoes a displacement by the reverse piezoelectric effect.

The inactive layer 9 consists of a plurality of layers of the piezoelectric material 1 where the internal electrode 2 is not provided, and therefore does not undergo a displacement even when a voltage is applied to the internal electrode 2.

The external electrodes 4 are formed on the opposing side faces of the stack 10 as described above, and the external electrodes 4 are connected to the internal electrodes 2 which are stacked in every other layer, and therefore a predetermined voltage applied between the two external electrodes 4 is applied via the internal electrode 2 to the piezoelectric layers 1, so that the piezoelectric layer 1 undergoes a displacement by the reverse piezoelectric effect.

In addition, the lead wires 6 are connected to the external electrodes 4 by soldering or the like, so that the external electrode 4 is connected via the lead wire 6 to a power source provided in the outside.

In the multi-layer piezoelectric element according to the first embodiment, the external electrode 4 is formed from an electrically conductive material and glass, a cleft 1a is formed in the superficial portion of the piezoelectric layer 1 in the interface between the external electrode 4 and the piezoelectric layer 1, the cleft 1a is filled with glass so as to firmly bond the external electrode 4 and the piezoelectric layer 1 with each other. Unless the cleft 1a that contains glass inside thereof is formed in the superficial portion of the piezoelectric layer 1, it becomes difficult to firmly bond the external electrode 4 and the piezoelectric layer 1, thus causing the external electrode 4 to peel off the side face of the stack when the multi-layer piezoelectric element is operated continuously over a long period time, resulting in contact failure and deterioration in the displacement characteristic. In this specification, the superficial portion of the piezoelectric layer 1 refers to a region in the vicinity of the surface which has substantially no influence on the piezoelectric characteristic of the piezoelectric layer 1 by the presence of the cleft 1a, a region preferably 100 μm or less from the surface of the piezoelectric layer 1. It is preferable that maximum width of the cleft 1a is 15 μm or less.

In the multi-layer piezoelectric element of the first embodiment, as described above, since the wedge that contains the glass formed in the cleft 1a and the glass that constitutes the external electrode 4 joining with each other with good affinity, the external electrode 4 and the piezoelectric layer 1 can be firmly bonded with each other by the wedge effect.

Figure 2A:
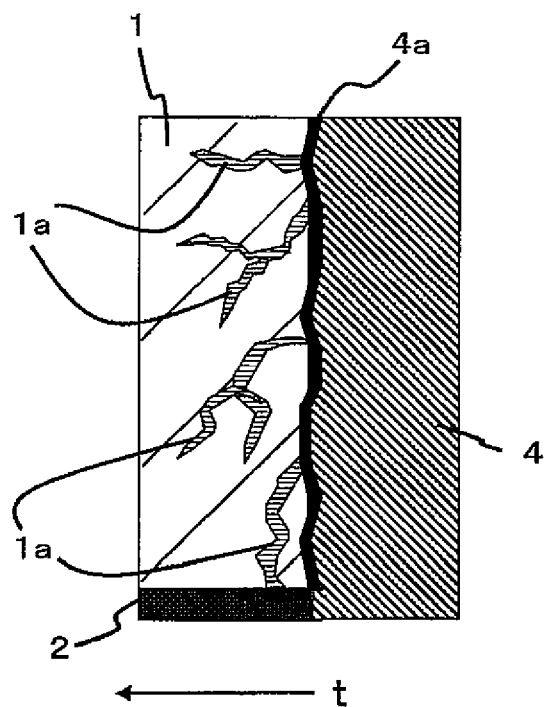
FIG. 2A is an enlarged section view showing the superficial portion of the piezoelectric layer of the multi-layer piezoelectric element according to the first embodiment.

The wedge effect of the wedge that contains the glass formed in the cleft 1a refers to the enhancement of the strength of bonding the external electrode 4 onto the piezoelectric layer 1, achieved as the glass that constitutes the external electrode 4 joins with the glass formed in the cleft which has such a structure as a wedge is driven into the piezoelectric layer 1 as shown in FIG. 2A. This constitution achieves high durability without the external electrodes 4 peeling off the side faces of the stack 10 even when operated continuously over a long period of time under high electric field and high pressure.

The cleft may be directed either perpendicular to the interface between the external electrode 4 and the piezoelectric layer 1 as shown in FIG. 2A or inclined thereto. Also the distal end of the cleft 1a may reach the inside of the internal electrode 2 or, alternatively, the cleft 1a may develop from the side of the internal electrode 2.

According to the present invention, selecting a type of glass having low softening point to form the wedge in the cleft 1a makes it possible to fill in the cleft 1a at a temperature well below the firing temperature of the piezoelectric layer 1, thus enabling it to suppress the characteristics of the piezoelectric layer 1 from changing.

For the glass component, silica glass, soda-lime glass, lead alkali silicate glass, aluminoborosilicate glass, borosilicate glass, aluminosilicate glass, borate glass, phosphate glass, lead glass or the like may be used.

The borosilicate glass, for example, may contain 40 to 70% by weight of $SiO_2$, 2 to 30% by weight of $B_2O_3$, 0 to 20% by weight of $Al_2O_3$, 0 to 10% by weight in total of oxides of alkali earth metals such as Mgo, CaO, SrO and BaO, and 0 to 10% by weight of oxide of alkali metal. The borosilicate glass may be such that contains 5 to 30% by weight of ZnO. ZnO has an effect of lowering the processing temperature of borosilicate glass.

Phosphate glass may contain 40 to 80% by weight of $P_2O_5$, 0 to 30% by weight of $Al_2O_3$, 0 to 30% by weight of $B_2O_3$, 0 to 30% by weight of ZnO, 0 to 30% by weight of oxides of alkali earth metals and 0 to 10% by weight of oxides of alkali metals.

The lead glass may contain 30 to 80% by weight of PbO, 0 to 70% by weight of $SiO_2$, 0 to 30% by weight of $Bi_2O_3$, 0 to 20% by weight of $Al_2O_3$, 0 to 30% by weight of ZnO, 0 to 30% by weight of oxides of alkali earth metals and 0 to 10% by weight of oxides of alkali metals.

In order to improve the affinity, it is preferable that the glass that constitutes the external electrode 4 and the glass that fills in the cleft have compositions which contain the same material as the main component.

Presence of glass that fills in the cleft 1a and the filling ratio of the cleft 1a with glass, which will be described later, can be determined by analyzing the constituent elements of the glass by EPMA (electron beam probe micro analysis).

The glass that fills in the cleft 1a and the glass which constitutes the external electrode 4 preferably contain the same component. By using the same glass component, bonding strength between the external electrode 4 and the piezoelectric layer 1 can be increased further and the cleft 1a can be filled with the glass in the same process in which the external electrodes 4 are baked, so that the number of manufacturing processes can be reduced.

The cleft 1a is provided preferably in the superficial portion of the piezoelectric layer 1 to a depth t of 100 μm or less from the interface between the external electrode 4 and the piezoelectric layer 1. When the cleft 1a having depth t exceeding 100 μm from the interface is provided in the superficial portion of the piezoelectric layer 1, it becomes difficult to fill the cleft 1a with glass and, at the same time, the cleft 1a may grow from the superficial portion of the piezoelectric layer further to the inside thus making a destruction initiating point or breaking the internal electrode 2. Length of the cleft 1a was measured by observing 10 positions in an arbitrarily selected section of the superficial portion of the piezoelectric layer 1 in the junction with the external electrode 4 under an SEM (scanning electron microscope) with 2000 times magnification.

Filling ratio of the cleft 1a with glass is preferably 70% or more. When the filling ratio is less than 70%, bonding strength between the glass that constitutes the external electrode 4 and the glass contained in the cleft 1a becomes weaker, thus giving rise to the possibility of the external electrode 4 peeling off the stack 10. Also because the void not filled with the glass increases in the cleft 1a, stress may be concentrated in the void during continuous operation over a long period of time, thus leading to breakage of the stack 10.

It is also preferable to form a glass layer between the side faces of the stack 10 and the external electrodes 4. Forming the glass layer enables it to cause the glass which constitutes the wedge to infiltrate the cleft 1a so as to fill in the void, and bond the glass which constitutes the external electrode 4 and the glass contained in the cleft 1a firmly with each other via the glass layer.

The piezoelectric layer 1 is formed, for example, from piezoelectric ceramic material which contains lead titanate zirconate Pb(Zr—Ti)$O_3$ (hereinafter abbreviated as PZT) or barium titanate $BaTiO_3$ as the main component. The piezoelectric ceramic material preferably has a high value of piezoelectric strain constant $d_{33}$ which represents the piezoelectric characteristic.

Thickness of the piezoelectric layer 1, namely the distance between the internal electrodes 2 is preferably in a range from 50 to 250 μm. When the thickness is in this range, the multi-layer piezoelectric actuator can be made in a compact and low profile construction despite increasing number of layers stacked for the purpose of achieving larger amount of displacement by applying a voltage, and it is made possible to prevent insulation breakdown from occurring in the piezoelectric layer 1.

The external electrode 4 is constituted from 80 to 99% by weight of electrically conductive material containing silver as the main component, with the rest consisting of 1 to 20% by weight of glass component, and is bonded with the side face of the piezoelectric layer 1 of the stack 10 mainly via the glass component contained in the external electrode 4. While the external electrode 4 is formed by baking an electrically conductive paste constituted from an electrically conductive material and glass, it is preferable that the paste shrink by 10% or more in the direction of thickness of the external electrode 4 when baked. By having the electrically conductive paste shrink by 10% or more in the direction of thickness when baked, it is made possible to generate the cleft 1a in the superficial portion of the piezoelectric layer 1 by making use of the stress caused by the shrinkage during baking, or to grow microscopic cracks existing in the superficial portion of the piezoelectric layer 1 to the cleft 1a having such a size that allows the glass to infiltrate therein.

The glass component which constitutes the external electrode 4 is preferably a kind of glass which contains at least one of lead oxide and silicon oxide and has softening point of 800° C. or lower, in order to increase the strength of bonding with the piezoelectric layer 1 and effectively fill in the cleft. The glass component may be, in addition to these described above, silica glass, soda-lime glass, lead alkali silicate glass, aluminoborosilicate glass, borosilicate glass, aluminosilicate glass, borate glass, phosphate glass, lead glass or the like.

The borosilicate glass, for example, may contain 40 to 70% by weight of $SiO_2$, 2 to 30% by weight of $B_2O_3$, 0 to 20% by weight of $Al_2O_3$, 0 to 10% by weight in total of oxides of alkali earth metals such as MgO, CaO, SrO and BaO, and 0 to 10% by weight of alkali metal oxide. The borosilicate glass may also be such that contains 5 to 30% by weight of ZnO. ZnO has an effect of lowering the processing temperature of borosilicate glass.

Phosphate glass may contain 40 to 80% by weight of $P_2O_5$, 0 to 30% by weight of $Al_2O_3$, 0 to 30% by weight of $B_2O_3$, 0 to 30% by weight of ZnO, 0 to 30% by weight of oxides of alkali earth metals and 0 to 10% by weight of oxides of alkali metals.

The lead glass may contain 30 to 80% by weight of PbO, 0 to 70% by weight of $SiO_2$, 0 to 30% by weight of $Bi_2O_3$, 0 to 20% by weight of $Al_2O_3$, 0 to 30% by weight of ZnO, 0 to 30% by weight of oxides of alkali earth metals and 0 to 10% by weight of oxides of alkali metals.

The electrically conductive material which constitutes the external electrode 4 preferably contains silver as the main component for the reason of resistance to oxidization, low value of Young's modulus and low cost. Trace of platinum or palladium may be added in order to suppress the trouble of electro-migration.

The stack 10 has grooves measuring 30 to 500 μm in depth and 30 to 200 μm in width in the direction of stacking formed in every other layer on the side face thereof. The grooves are filled with glass, epoxy resin, polyimide resin, polyamide-imide resin, silicone rubber or the likes so as to form the insulator 3. The insulator 3 is preferably made of a material which has a low modulus of elasticity, particularly silicone rubber, which can accommodate the displacement of the stack 10, in order to make the bonding with the stack 10 stronger.

The method of manufacturing the multi-layer piezoelectric actuator comprising the multi-layer piezoelectric element of the present invention will now be described.

In order to make the multi-layer piezoelectric actuator of the present invention, first, a calcined powder of a piezoelectric ceramic material constituted from PZT or the like, a binder made of an organic polymer such as acrylic resin or butyral resin and a plasticizer such as DBP (dibutyl phthalate) or DOP (dioctyl phthalate) are mixed to form a slurry. The slurry is formed into ceramic green sheets, that would become the piezoelectric layers 1, by doctor blade process, calender roll process or other known tape molding method.

Then silver-palladium powder, a binder, a plasticizer and, as required, the calcined powder of the piezoelectric ceramic material are mixed to prepare an electrically conductive paste that would become the internal electrode 2. This electrically conductive paste is applied onto the top surface of the ceramic green sheets by screen printing method or the like to a thickness of 1 to 40 μm.

A plurality of the green sheets having the electrically conductive paste printed on the top surface thereof are stacked one on another, with the stack being heated at a predetermined temperature to remove the binder. The stack is then fired at a temperature in a range from 900 to 1200° C. thereby to make the sintered stack.

Method of preparing the sintered stack is not limited to that described above, and any method may be employed as long as such a sintered stack can be made that is constituted from the plurality of piezoelectric layers 1 and the plurality of internal electrodes 2 placed one on another.

The sintered stack thus obtained is ground by a surface grinding machine or the like using a grinding wheel of grain size coarser than #6000, thereby to obtain the stack 10 of the predetermined dimensions. At this time, microscopic cracks are formed in the surface of the stack 10. The microscopic crack serves as a starting point for growing the cleft 1a formed in the superficial portion of the piezoelectric layer 1 in the interface between the piezoelectric layers 1 and the external electrode 4 when forming the external electrode 4.

Figure 3A:
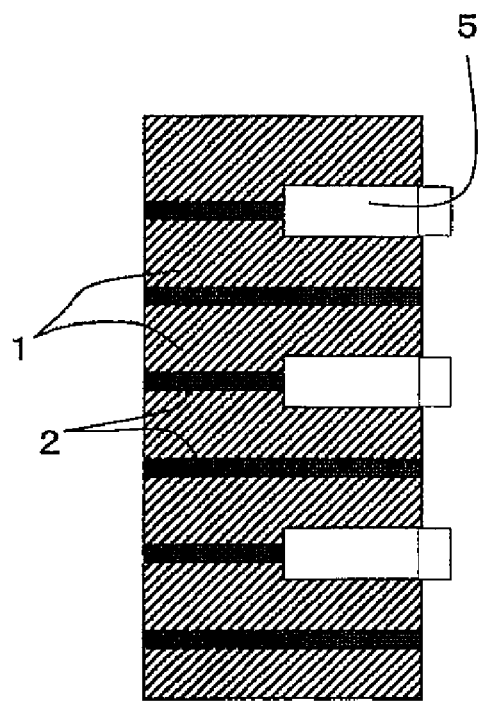
FIG. 3A is a partial section view showing grooves formed in the side face of the stack by a dicing apparatus or the like in the process of manufacturing the multi-layer piezoelectric element according to the first embodiment.
Figure 3B:
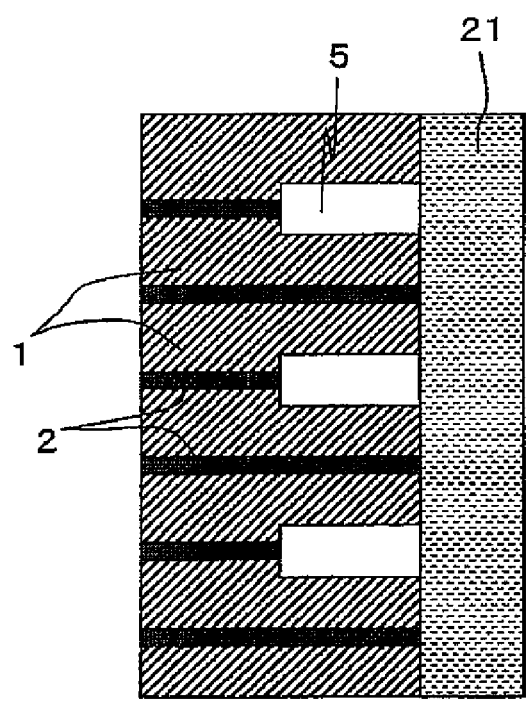
FIG. 3B is a partial section view showing electrically conductive paste applied to the side face of the stack after the grooves have been formed therein in the process of manufacturing the multi-layer piezoelectric element according to the first embodiment.

Then grooves 5 measuring 30 to 500 μm in depth and 30 to 200 μm in width in the direction of stacking are formed in every other layer on the side face of the stack 10 as shown in FIG. 3A by a dicing apparatus or the like.

The method of forming the external electrodes 4 will now be described.

First, a mixture of 80 to 99% by weight of silver powder having particle sizes from 0.1 to 10 μm and 1 to 20% by weight of glass powder containing at least one of lead oxide and silicon oxide having particle sizes from 0.1 to 10 μm is mixed with a binder so as to prepare an electrically conductive paste 21.

The electrically conductive paste 21 is applied to a film which has been treated to facilitate releasing, by screen printing to a thickness of 5 to 40 μm. After drying, the electrically conductive paste sheet 21 is removed from the release film. At this time, it is preferable to set the powder filling ratio of the silver powder and the glass powder combined in the electrically conductive paste 21 after drying in a range from 40 to 75%. The electrically conductive paste 21 is then transferred onto the surface of the stack 10 where the groove is formed and the external electrode 4 is to be formed as shown in FIG.

3B, and is fired at such a temperature that is higher than the softening point of the glass component and is not higher than the melting point of silver, thereby forming the external electrodes 4.

The cleft 1*a* formed by grinding as described above grows under the influence of the stress generated by the shrinkage of the electrically conductive paste during baking. At the same time, the glass component contained in the electrically conductive paste 21 fills in the cleft 1*a* by the capillary action at a temperature higher than the softening point of the glass component contained in the electrically conductive paste 21, while the glass component contained in the electrically conductive paste 21 selectively concentrates in the superficial portion of the piezoelectric layer 1, thus forming a glass layer 4*a*. At this time, the glass which fills the cleft 1*a* and the glass layer 4*a* formed on the superficial portion of the piezoelectric layer 1 are firmly joined with each other. That is, the glass component of the external electrode 4 forms a kind of wedge which is driven into the superficial portion of the piezoelectric layer 1, so as to firmly connect the external electrode 4 and the stack 10 with each other.

At this time, mutual diffusion of silver-palladium which constitutes the internal electrode 2 and silver contained in the external electrode 4 makes strong bonding between the internal electrode 2 and the external electrode 4.

In order to effectively form the glass layer in the interface between the external electrode 4 and the piezoelectric layer 1, the electrically conductive paste sheet 21 may be formed into a multi-layer structure, or the glass component may be contained in the electrically conductive paste sheet 21 with graded concentration. Specifically, by forming such a distribution as the concentration of glass is higher toward the superficial portion of the piezoelectric layer 1, it is made possible that the glass component effectively infiltrates the crack of the superficial portion of the piezoelectric layer 1 during baking, thereby forming the glass layer 4*a* in the interface between the piezoelectric layers 1 and the external electrode 4.

The glass layer 4*a* may be provided on the superficial portion of the piezoelectric layers 1 in the stage of the electrically conductive paste sheet 21, or the glass layer 4*a* may also be formed between the stack 10 and the external electrode 4 in the stage of baking. In this case, too, mutual diffusion of silver-palladium which constitutes the internal electrode 2 and silver contained in the electrically conductive paste 21 makes strong bonding during baking, since the glass component has poor wettability with the internal electrode 2 which is exposed on the side face of the stack 10.

Method of forming the external electrode 4 is not limited to that described above, and the external electrode 4 may also be directly formed on the side face of the stack 10.

It is preferable that the electrically conductive paste 21 shrinks by 10% or more in the direction of thickness when baked. By setting the shrinkage ratio to 10% or more, it is made possible to effectively generate the cleft 1*a* in the superficial portion of the piezoelectric layer 1 by making use of the stress caused by the shrinkage during baking.

The shrinkage ratio is the proportion of the difference between the dry thickness and the baked thickness of the electrically conductive paste sheet 21 to the dry thickness, given in terms of percentage.

Shrinkage ratio of the electrically conductive paste 21 in the direction of thickness when baked can be formed without the presence of microscopic cracks during the grinding process, and shrinkage ratio is preferably 20% or more in order to form the cleft 1*a* through shrinkage of the electrically conductive paste 21.

Figure 2B:
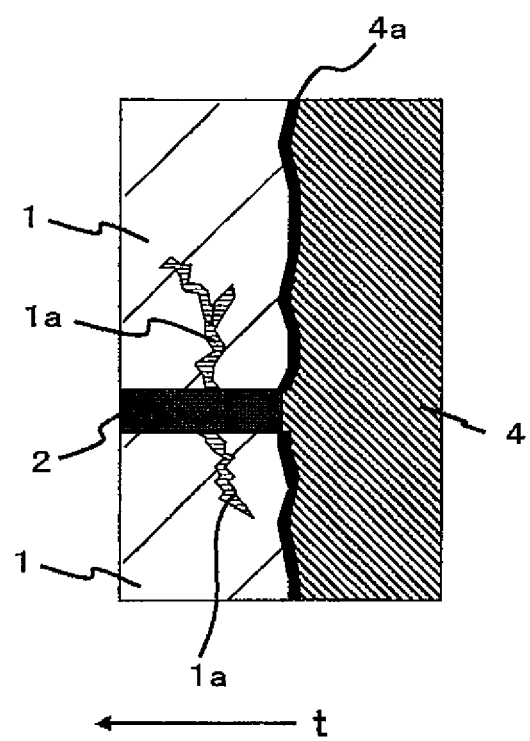
FIG. 2B is an enlarged section view showing another portion of the superficial portion of the piezoelectric layer of the multi-layer piezoelectric element according to the first embodiment.

Shrinkage of the electrically conductive paste 21 may cause the distal end of the internal electrode 2 which undergoes diffusion bonding with the silver contained in the external electrode 4 to be pulled by the external electrode 4, so as to generate the cleft 1*a* starting in the internal electrode 2, eventually forming a wedge containing glass in the cleft 1*a* as shown in FIG. 2B.

Thickness of the external electrode 4 is preferably smaller than the thickness of the piezoelectric layer 1, and is more preferably not larger than 50 μm for the purpose of accommodating the expansion and shrinkage of the stack which is the main body of the actuator.

Composition of the electrically conductive paste is set to 80 to 99% by weight of silver powder and 1 to 20% by weight of glass powder for the following reasons. When the content of the silver powder is less than 80% by weight, localized heat generation may occur in the external electrode 4 when a large current is supplied for high speed operation, because the external electrode 4 has a high specific resistance. When the content of the silver powder is higher than 99% by weight, on the other hand, relatively low content of the glass component makes the bonding strength between the external electrode 4 and the stack 10 weaker, which may result in such a problem as the external electrode 4 peels off the stack 10 during operation.

Bonding strength between the external electrode 4 and the stack 10 can be increased by having the glass component of the electrically conductive paste contain at least one of lead oxide and silicon oxide.

Then the stack 10 having the external electrodes 4 formed thereon is immersed in a silicone rubber solution while deaerating the silicone rubber solution by evacuation, so as to fill the groove 5 of the stack 10 with the insulator 3 consisting of the silicone rubber. Then the stack 10 is pulled out of the silicone rubber solution, so that the stack 10 is coated with the silicone rubber on the side faces thereof. Then the silicon rubber that fills the groove 5 and covers the side faces of the stack 10 is hardened.

Then the lead wires 6 are connected to the external electrodes 4 by soldering or the like thereby completing the multi-layer piezoelectric actuator comprising the multi-layer piezoelectric element of the present invention.

Constitution of the multi-layer piezoelectric actuator which uses the multi-layer piezoelectric element of the present invention is not limited to the example described above, and modifications can be made to the extent that does not deviate from the spirit of the present invention. For example, while the concave groove 5 filled with the insulator 3 is provided in the example described above, such a constitution like a prior electrode lead-out section of multi-layer ceramic condenser may also be employed as an end of the internal electrode 2 is connected to the external electrode 4 in every other layer while insulation is maintained so that the other end of the internal electrode 2 is not connected to the external electrode 4.

Through the lead wires 6, DC voltage of 0.1 to 3 kV/mm is applied between the pair of external electrodes 4 so as to apply polarization treatment to the stack 10, thereby to complete the multi-layer piezoelectric actuator. When the lead wires 6 are connected to an external voltage source and the voltage is supplied via the lead wires 6 and the external electrodes 4 to the internal electrodes 2, the piezoelectric layers 1 undergo a significant amount of displacement by the reverse piezoelectric effect, so as to drive, for example, an automobile fuel injection valve that supplies fuel to an engine.

Second Embodiment

The multi-layer piezoelectric element according to the second embodiment of the present invention is made similarly to the first embodiment, except that the green ceramic stack, made by stacking a plurality of green sheets (green ceramic layers) having the electrically conductive paste printed on the top surface thereof, is subjected to binder removal operation and fired after cutting the stack by a method to be described later.

The green ceramic stack may be cut by dicing, cutting or water jet, among which water jet is preferably employed since water jet is directed with a high pressure from a small nozzle to an object to be cut, and therefore the process is not affected by heat unlike the dicing process.

However, in the conventional method of cutting the green ceramic stack by means of water jet, since water jet of high pressure contains abrasive particles made of garnet, there has been such a problem as the garnet particles remain on the cut surface of the green ceramic stack or inside thereof. The garnet particles, if allowed to remain on the cut surface of the green ceramic stack or inside thereof, cannot be removed by cleaning the cut surface. When the green ceramic stack which contains such impurities is fired, crack and/or peel-off occur in the ceramic stack after firing, due to the difference in shrinkage ratio of the green ceramic stack during firing as the ceramic particles which constitute the green ceramic stack and the garnet particles have different densities.

For this reason, the green ceramic stack is cut in such a procedure as described below in the second embodiment.

The method of cutting the green ceramic stack according to the second embodiment will be now described below with reference to the accompanying drawings.

Figure 4:
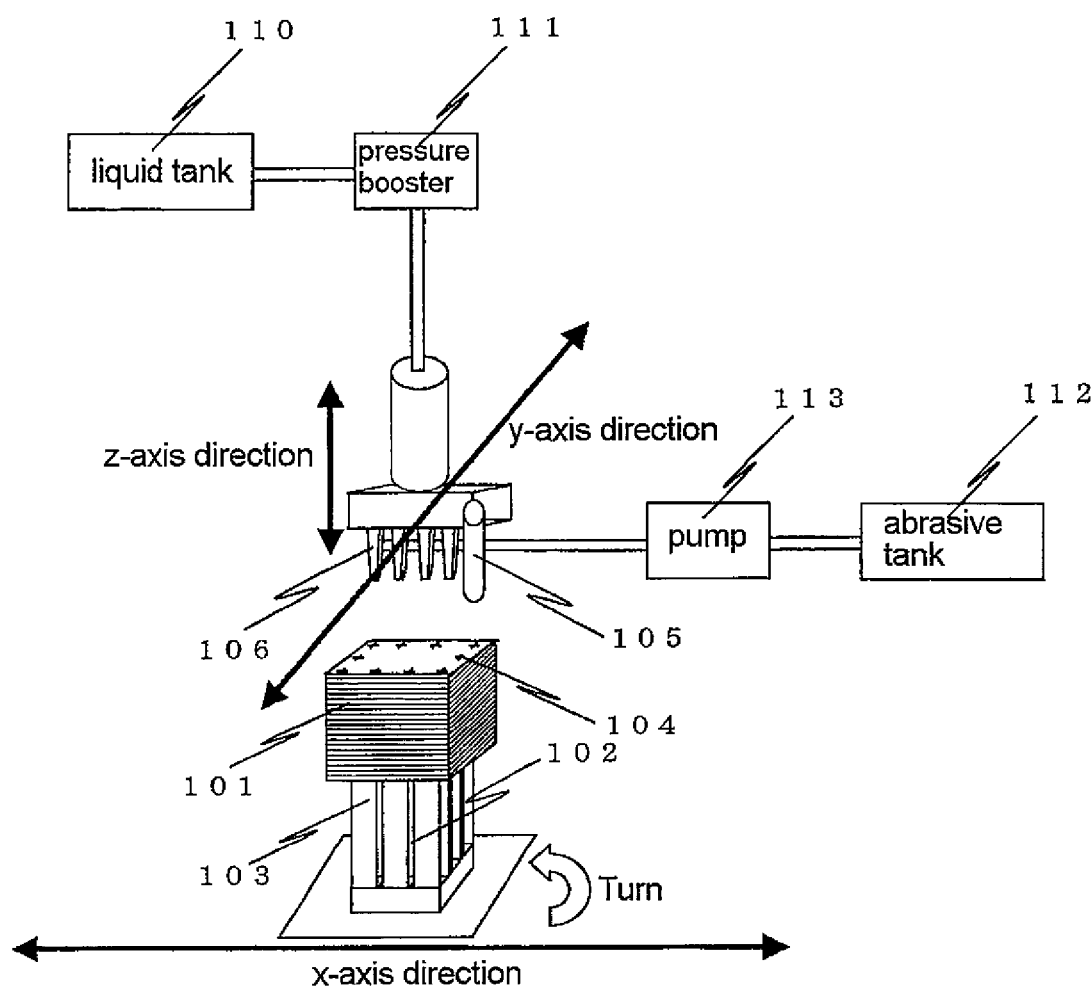
FIG. 4 is a block diagram schematically showing a cutting apparatus for the green ceramic stack according to second embodiment of the present invention.
Figure 5:
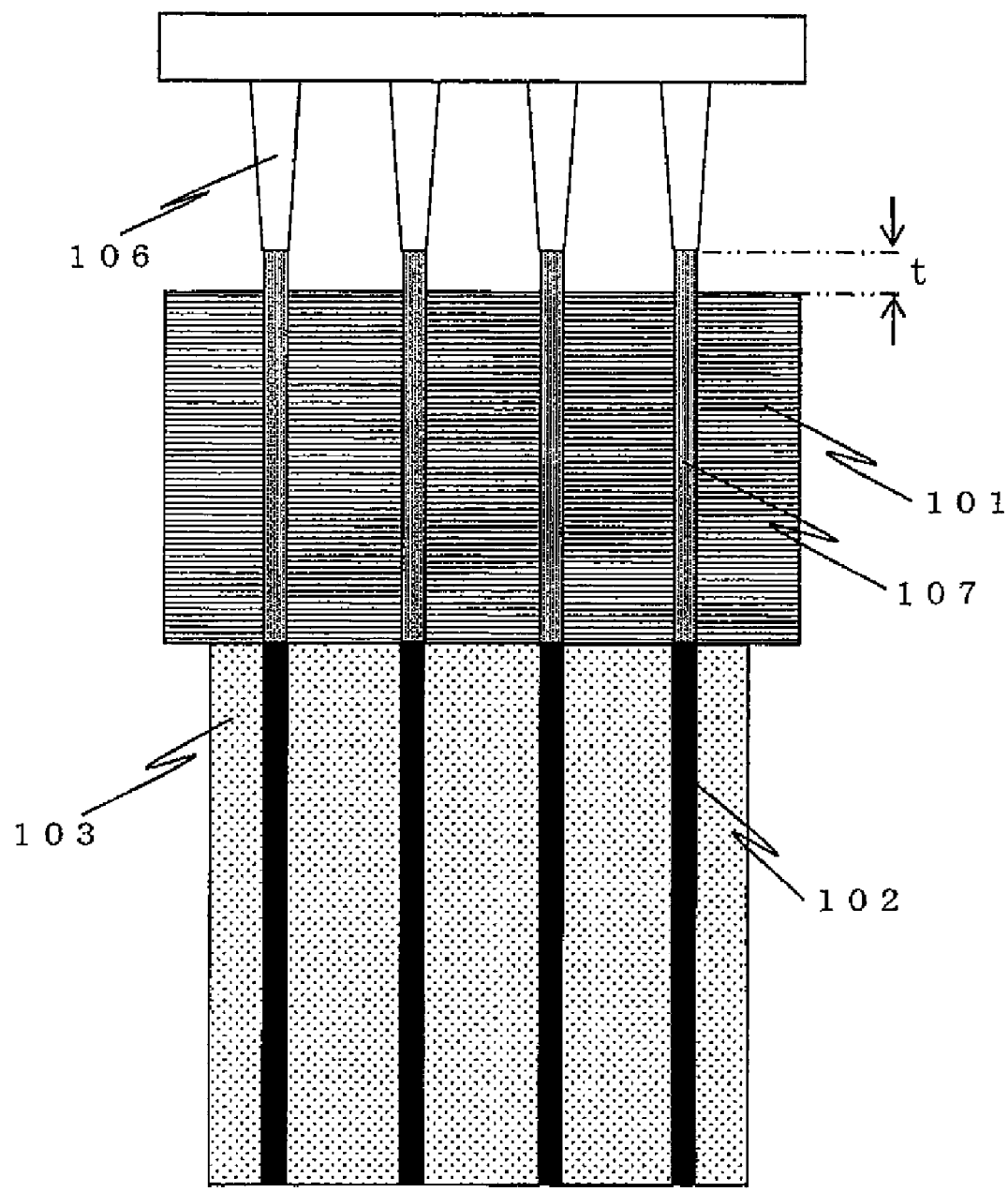
FIG. 5 is an enlarged side view of the jet nozzle 106 shown in FIG. 4 and a portion of liquid jet 10 discharged therefrom.

FIG. 4 is a block diagram schematically showing the constitution of a cutting apparatus used for the green ceramic stack according to the second embodiment, and FIG. 5 is an enlarged side view of a jet nozzle 106 and a portion of the liquid jet 107 discharged therefrom.

In the cutting apparatus shown in FIG. 4, the green ceramic stack 101 is placed on a grinding machine 103 which has a plurality of drain grooves 102 and a servo motor for making movement in x-axis direction. A plurality of jet nozzles 106 are provided above the grinding machine 103, with a jet nozzle unit provided with a servo motor for making movement in y- and z-axis directions. The jet nozzle unit is designed so as to move each of the nozzles 106 to a position right above the start point of cutting the green ceramic stack 101 as a camera 105 captures the image of a cut mark 104 formed on the top surface of the green ceramic stack 101. The nozzles 105 are made of, for example, stainless steel or the like.

Each nozzle 106 is connected to a liquid tank 110 via a pressure booster 111, and is connected to an abrasive material tank 112 via a pump 113. With such a constitution, the liquid supplied from the liquid tank 110 is pressurized by the pressure booster 111, is mixed with the abrasive particles supplied from the abrasive material tank 112 by the pump 113, and is discharged from the jet nozzle 106 in the form of liquid jet 107.

The liquid jet 107 discharged with a high pressure from the jet nozzle 106 first hits the cut mark 104 provided on the top surface of the green ceramic stack 101 and, as the nozzle moves along the line of the cut mark 104, the green ceramic stack 101 is cut off in this direction. To cut the green ceramic stack 101 in other direction, the grinding machine 103 is turned so as to cut the green ceramic stack 101 which has been repositioned.

The liquid jet 107 which has been used in cutting is drained through the drain grooves formed in lattice configuration on the grinding machine 103 and is separated into liquid and abrasive particles, which are recovered in the liquid tank 10 and the abrasive material tank 12, respectively, although not shown in the drawing.

The method of cutting the green ceramic stack according to the second embodiment is characterized in that the green ceramic stack 101 is cut by using the liquid jet 107 of high pressure which contains abrasive particles made of ceramic particles similar to the ceramic material that constitutes the green ceramic stack 101.

When abrasive particles made of a different ceramic material from that of the green ceramic stack 101 are used, the abrasive particles which enter or remain on the cut surface of the green ceramic stack 101 cause cracks or peel-off near the surface of the ceramic stack after firing.

When the ceramic stack having cracks or peel-off near the surface thereof is ground with a grinding wheel having relatively coarse grains so as to form the cleft 1a in the surface as described in the first embodiment, unnecessarily large cracks may be generated or such cracks may result that make it impossible to form wedges which are integrated with the glass of the external electrode.

In case the green ceramic stack is cut by using the liquid jet 107 of high pressure which contains abrasive particles made of similar ceramic material as the green ceramic stack 101, composition of the green ceramic stack 101 does not change even when the abrasive particles made of similar ceramic material enter the cut surface. As a result, the cleft which allow it to form the wedge controlled the depth and shape to be easy to integrate with the glass of the external electrode, can be formed by grinding with a relatively coarse grinding wheel after firing.

The abrasive particles made of ceramic material of the same nature as the green ceramic stack 101 here means that which has the same main component as that of the ceramic material that constitutes the green ceramic stack 101. It is preferable that abrasive particles made of the same composition as ceramic material that constitutes the green ceramic stack 101 are used for cutting the green ceramic stack 101.

In the second embodiment, it is preferable that mean particle size of the abrasive particles contained in the liquid jet 107 is controlled within a range from 10 to 500 μm. When the mean particle size of the abrasive particles is less than 10 μm, the liquid jet 107 has low grinding power unable to efficiently cut the green ceramic stack 101. When the mean particle size of the abrasive particles exceeds 500 μm, flow velocity of the liquid jet 107 discharged from the jet nozzle 106 becomes slower, disabling it to maintain straight flow of the liquid jet 107 and resulting in poor accuracy of cutting the green ceramic stack 101.

According to the second embodiment, it is preferable that the liquid jet 107 electrical conductivity of 1.0 μS/cm or less. This is because a liquid having high electrical conductivity contains much electrolyte and the electrolyte enters the cut surface as an impurity when cutting the green ceramic stack 101.

Distance t between the jet nozzle 106 and the green ceramic stack 101 is preferably controlled in a range from 0.1 to 3.0 mm. When the distance t is less than 0.1 mm, the nozzle 106 may touch a high point of the surface of the stack caused by the fluctuation in thickness of the green ceramic stack 101 during the forming process, and discharge of the liquid jet 107 may be hampered. When the distance t is larger than 3.0 mm, the liquid jet 107 may diffuse before reaching the green ceramic stack 101, thus resulting in a decrease of cutting power or wider cutting slit in the green ceramic stack 101.

In the second embodiment, the pressure of discharging the liquid jet 107 is preferably in a range from 100 to 400 MPa. A pressure lower than 100 MPa results in low efficiency of cutting when abrasive particles made of the same composition as ceramic material that constitutes the green ceramic stack 101 are used for cutting the green ceramic stack 101. When the pressure of discharging the liquid is higher than 400 MPa, the liquid jet 107 has excessively high grinding power. When the grinding power is too high, lumps of ground powder generated from the green ceramic stack 101 during cutting grow in size. Cutting the green ceramic stack 101 with the liquid jet 107, which contains the ground powder, results in an uneven cut surface and in low cutting accuracy of the liquid jet 107.

In the second embodiment, it is preferable that the quantity of the abrasive particles supplied from the jet nozzle 106 is in a range from 100 to 400 g/minute. When the quantity of the abrasive particles is less than 100 g/minute, the liquid jet 107 has low grinding power. When the quantity of the abrasive particles exceeds 400 g/minute, flow velocity of the liquid jet 107 discharged from the jet nozzle 106 becomes slower, disabling it to maintain straight flow of the liquid jet 107 and resulting in poor accuracy of cutting the green ceramic stack 101.

In the second embodiment, a plurality of the jet nozzles 106 are provided so as to cut along a plurality of lines in order to efficiently cut the green ceramic stack 101 in a shorter period of time. However, the present invention is not limited to this constitution, and it suffices to provide a single jet nozzle 106.

In the second embodiment, drain grooves 102 are formed in lattice configuration in the grinding machine 103 whereon the green ceramic stack 101 is to be placed. With this constitution, since the liquid jet 107 which has cut the green ceramic stack 101 is drained through the drain grooves 102 of lattice configuration, accuracy of cutting the green ceramic stack 101 with the liquid jet 107 is not adversely affected by the liquid bouncing off the grinding machine 103. Also the grinding power of the liquid jet 107 is not decreased by the collision of the liquid jet 107 which bounces off the grinding machine 103.

In case the drain grooves 102 having lattice configuration are not formed in the grinding machine 103, the liquid jet 107 which has been discharged from the jet nozzle 106 and has cut the green ceramic stack 101 bounces off the grinding machine 103. As a result, the liquid jet 107 running forward from the nozzle is deviated from straight flowing direction due to collision of the liquid jet 107 bouncing off and the forward liquid jet 107, thus disabling precise cutting.

The arrangement of the drain grooves 102 is not limited to lattice configuration, and any arrangement can be employed as long as the liquid jet 107 which has cut the green ceramic stack 101 can be drained off.

Third Embodiment

Figure 6:
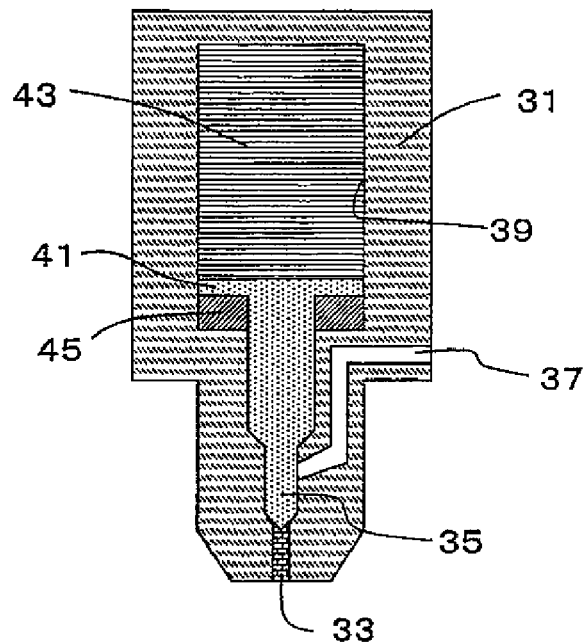
FIG. 6 is a sectional view showing the constitution of an injection apparatus using the multi-layer piezoelectric actuator of the present invention.
Figure 7:
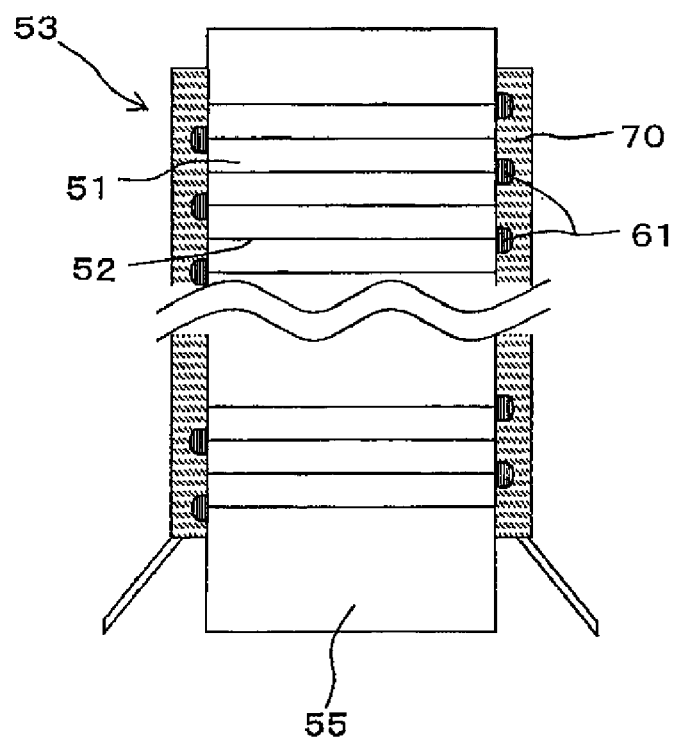
FIG. 7 is a side view of a multi-layer piezoelectric actuator of the prior art.

FIG. 6 shows an injection apparatus according to the third embodiment constituted from the multi-layer piezoelectric element of the present invention, comprising a casing 31 which has an injection hole 33, a piezoelectric actuator 43 housed in the casing 31, and a valve 35 which is driven by the multi-layer piezoelectric actuator to discharge the liquid from the injection hole 33.

The injection hole 33 is provided with a fuel passage 37 disposed so as to communicate therewith. The fuel passage 37 is connected to a fuel source that is provided outside of the apparatus, so as to receive a fuel supplied thereto at a high pressure that remains always constant. When the needle valve 35 opens the injection hole 33, the fuel that fills the fuel passage 37 is injected at a predetermined level of high pressure into a fuel chamber of an internal combustion engine (not shown).

The valve 35 has an enlarged top portion where the diameter is made larger, forming a cylinder 39 housed in the casing 31 and a piston 41 which makes sliding motion with respect to the cylinder 39.

In such an injection apparatus, when the piezoelectric actuator 43 expands in response to a voltage applied thereto, the piston 41 is pressed so that the needle valve 35 plugs the injection hole 33, thereby stopping the supply of fuel. When the voltage is removed, the piezoelectric actuator 43 shrinks and a coned disc spring 45 pushes back the piston 41, so that the injection hole 33 communicates with the fuel passage 37 and the fuel is discharged.

EXAMPLES

Example 1

In Example 1, the multi-layer piezoelectric actuator consisting of the multi-layer piezoelectric element according to the first embodiment of the present invention was made as follows.

First, a calcined powder of a piezoelectric ceramic material constituted from PZT as the main component, a binder and a plasticizer were mixed to form a slurry which was formed into ceramic green sheets that would become the piezoelectric material 1 having thickness of 150 μm by the doctor blade process.

An electrically conductive paste, prepared by adding a binder to the silver-palladium alloy, was applied to one side of the ceramic green sheet by screen printing method to a thickness of 3 μm. Then 300 pieces of the ceramic green sheets were stacked and fired at a temperature from 980 to 1100° C. thereby obtaining fired stack. Then the fired stack was ground using a grinding wheel having grain size of #400 thereby to obtain the stack 10 shown in FIG. 1A and FIG. 1B. The stack 10 thus obtained had microscopic cracks formed in the surface of the piezoelectric layer 1.

Then a groove measuring 50 μm in depth and 30 μm in width was formed at the end of the internal electrode 2 on the side face of the stack 10 in every other layer, by means of a dicing apparatus, as shown in FIG. 3A.

Then a mixture of 80 to 99% by weight of silver powder having mean particle size of 2 μm and a glass powder containing at least one of lead oxide and silicon oxide having mean particle sizes of 2 μm was mixed with a binder so as to prepare an electrically conductive paste.

The electrically conductive paste was then applied to a release film by screen printing to a thickness of 5 to 40 μm. After drying, the electrically conductive paste sheet was removed from the release film, so as to obtain silver paste sheets. At this time, powder filling ratio of the silver paste sheet was 55%. Then the silver paste sheets were transferred onto the pair of side faces of the stack 10 where the groove had been formed, and was fired at 800° C. for 15 minutes.

At this time, a glass layer 4a containing localized distribution of glass component was formed in the superficial portion of the piezoelectric layer 1 side of the external electrode 4. Shrinkage ratio of the electrically conductive paste 21 in the direction of thickness was 40% (thickness after firing was 60% of the dry thickness). Observation of the photograph of the cross section showed the existence of cleft 1a measuring 5 to 20 μm in length in the superficial portion of the piezoelectric layer 1 in the junction with the external electrode 4, and the cleft 1a was filled with glass that constitutes the external electrode 4 thus forming a wedge containing glass.

Then lead wires were connected to the external electrodes, and DC electric field of 3 kV/mm was applied between the positive and negative external electrodes via the lead wires so as to apply polarization treatment for 15 minutes, thereby to complete the multi-layer piezoelectric actuator consisting of the multi-layer piezoelectric element of the present invention shown in FIG. 1.

In Example 1, the multi-layer piezoelectric actuators (samples Nos. 1 through 5) were made by the manufacturing method described above, except for varying the grain size (coarseness) of the grinding wheel used in grinding the fired stack, the kind of the electrically conductive paste which constituted the external electrode 4 and the baking temperature.

As Comparative Example, multi-layer piezoelectric actuator (sample No. 6) where the cleft 1a was not substantially formed in the superficial portion of the piezoelectric layer 1 was made by grinding the sintered stack with a grinding wheel having fine grain size and using the electrically conductive paste 21 having extremely low shrinkage ratio during firing in forming the external electrode 4, thereby forming the external electrode 4. The multi-layer piezoelectric actuator of sample No. 6 did not include glass layer in the superficial portion of the piezoelectric layer 1 side of the external electrode 4.

When a DC voltage of 185 V was applied to the various multi-layer piezoelectric actuators thus obtained, all multi-layer piezoelectric actuators underwent displacement of 49 μm in the direction of stacking. Operation test was conducted on these multi-layer piezoelectric actuators by applying an AC voltage varying between 0 and +185 V at frequency of 150 Hz at room temperature, to carry out 1×10⁶ cycles.

Presence of the cleft 1a was determined by observing 20 positions in the interface between the external electrode 4 and the piezoelectric layer 1 under an SEM. Filling ratio of the cleft 1a with glass is given in the proportion of the area of the glass portion which fills the cleft 1a to the area of each cleft 1a in the SEM photograph of the cross section, in terms of the percentage, with the lowest value of filling ratio shown in Table 1. Presence and composition of glass were determined by analyzing the surface by EPMA. Depth of the cleft was given in terms of the maximum depth of the cleft observed in the SEM photograph of the cross section. Appearance after the operation test was observed in the interface between the external electrode 4 and the piezoelectric layer 1 under an SEM. Percentage change in the amount of displacement is given in terms of the ratio of the amount of displacement after continuous operation to the amount of displacement before the operation test. The results are shown in Table 1.

TABLE 1

| No. | Presence of crack | Glass filling ratio (%) | Depth of crack (μm) | After 1 × 10⁶ cycles of operation | |
|---|---|---|---|---|---|
| | | | | Appearance | Change in the amount of displacement |
| 1 | Present | 90 | 50 | GOOD | None |
| 2 | Present | 70 | 50 | GOOD | None |
| 3 | Present | 65 | 50 | GOOD | None |
| 4 | Present | 90 | 100 | GOOD | None |
| 5 | Present | 90 | 110 | GOOD | None |
| *6 | No change | — | — | Peeled at several points (External electrode) | Decreased by 40% |

Sample marked with * is out of the scope of the present invention.

Glass filling ratio (%) in Table 1 is the proportion of the space in the cleft occupied by glass.

From Table 1, it can be seen that in the multi-layer piezoelectric actuator of sample No. 6, made as Comparative Example, glass portion was not formed in the cleft 1a since the cleft 1a did not substantially exist in the superficial portion of the piezoelectric layer 1. As a result, the wedge effect of the glass portion was not obtained and the external electrode 4 peeled off the surface of the stack at several positions while showing a decreased amount of displacement after 1×10⁶ cycles of operation.

In the multi-layer piezoelectric actuators of samples Nos. 1 through 5 of the present invention, in contrast, since the cleft 1a was formed in the superficial portion of the piezoelectric layer 1 in the junction with the external electrode 4 and the cleft 1a was filled with glass, the wedge formed from the glass in the cleft 1a firmly joined the external electrode 4 and the surface of the stack. As a result, the external electrode 4 did not peel off the surface of the stack and the problem of decreased amount of displacement did not occur after operating the multi-layer piezoelectric actuator at a high speed.

The samples were subjected to 1×10⁹ cycles of operation under the same conditions as described previously, with results as shown in Table 2.

TABLE 2

| No. | Presence of crack | Glass filling ratio (%) | Depth of crack (μm) | After 1 × 10⁹ cycles of operation | |
|---|---|---|---|---|---|
| | | | | Appearance | Change in the amount of displacement |
| 1 | Present | 90 | 50 | GOOD | No change |
| 2 | Present | 70 | 50 | GOOD | No change |
| 3 | Present | 65 | 50 | Partial peel-off (External electrode) | Decreased by 5% |
| 4 | Present | 90 | 100 | GOOD | No change |
| 5 | Present | 65 | 110 | Partial wire breakage (Internal electrode) | Decreased by 10% |
| *6 | None | — | — | External electrode was burned | Short circuiting |

Sample marked with * is out of the scope of the present invention.

Glass filling ratio (%) in Table 1 is the proportion of the space in the cleft occupied by glass, and depth of cleft is the depth from the interface between the external electrode and the piezoelectric layer.

From Table 2, it can be seen that in the multi-layer piezoelectric actuator of sample No. 3, low filling ratio of the cleft 1a with glass less than 70% resulted in weak wedge effect of the glass. As a result, bonding strength between the external electrode 4 and the piezoelectric layer 1 was decreased, and a part of the external electrode 4 peeled off the surface of the stack during operation while showing a decreased amount of displacement.

In the multi-layer piezoelectric actuator of sample No. 5, since depth of the cleft 1a was larger than 100 μm, possibility became higher for part of the cleft 1a to grow and reach other cleft 1a so as to form a larger cleft 1a, thus the cleft 1a penetrated through part of the internal electrode 2 and resulted in wire breakage and decreased amount of displacement.

In the multi-layer piezoelectric actuators of samples Nos. 1, 2 and 4, in contrast, since depth of the cleft 1a was 100 μm or smaller from the interface between the piezoelectric layer 1 and the external electrode 4 and 70% or more of the cleft was filled with glass, the external electrode 4 did not peel off the surface of the stack and the problem of decreased amount of displacement did not occur after operating the multi-layer piezoelectric actuator at a high speed and long time.

Examples 2 through 6 are related to the method of cutting the green ceramic stack according to the second embodiment of the present invention.

In Examples 2 through 6, the green ceramic stack was made as follows.

First, a calcined powder of lead titanate zirconate Pb(Zr—Ti)O$_3$, a binder made of an organic polymer and a plasticizer were mixed to form a slurry which was formed into ceramic green sheets having thickness of 150 μm by slip casting process.

An electrically conductive paste containing silver-palladium that would form the internal electrode 2 for forming the internal electrode 2 was applied to one side of the ceramic green sheet by screen printing method to a thickness of 5 μm. Then after drying the electrically conductive paste, 400 pieces of the green sheets with the electrically conductive paste applied thereon were stacked. 10 pieces of the green sheets without the electrically conductive paste applied thereon were stacked on both ends of the stack in the direction of stacking, thereby making the green ceramic stack 101.

In Examples 2 through 6, pure water having electrical conductivity of 1.0 μS/cm or less was used as the liquid of the liquid jet 107, except for Example 4.

Example 2

The green ceramic stack 101 of the present invention made by the method described above was cut, by using ceramic particles of the same property as the green ceramic stack 101 for the abrasive particles contained in the liquid jet 107. Impurities mixing in during cutting and the condition of cut surface of the green ceramic stack 101 after firing were investigated.

As Comparative Example, the green ceramic stacks 101 were cut with the liquid jet 107 which contained garnet abrasive particles having mean particle size of 100 μm and the liquid jet 107 which did not contain the abrasive particles.

Cutting performance, entry of impurities and the presence of crack and peel-off of the green ceramic stack 101 which was cut as described above were evaluated. For the cutting performance, sample which was cut precisely through the bottom layer of the green ceramic stack 101 was rated as "GOOD", and sample which could not be cut was rated as "BAD". Entry of impurities was evaluated by observing the cut surface under a binocular microscope to determine the existence of particles of different composition. Presence of crack and peel-off was evaluated by observing the cut surface of the green ceramic stack 101 under a binocular microscope after firing. The results are shown in Table 3.

TABLE 3

| Sample No. | Abrasive particle | Cutting | Entry of impurity | Crack, peel-off | Comprehensive evaluation |
|---|---|---|---|---|---|
| 1 | Same ceramics | GOOD | GOOD None | GOOD None | GOOD |
| *2 | Garnet | GOOD | BAD Present | BAD Present | BAD |
| *3 | None | BAD | BAD Present | — | BAD |

Entry of impurity in Table 3 means mixing of impurity into the green ceramic stack.

From Table 3, it can be seen that in sample No. 2 made as Comparative Example, cutting with the liquid jet 107 which contained garnet abrasive particles resulted in the entry of the garnet abrasive particles in the cut surface of the green ceramic stack 101, with the particles remaining in the ceramic layer. Since the portion where the garnet abrasive particles remained had a composition which contained the main component different from that of the ceramic layer, firing of the green ceramic stack 101 with the garnet abrasive particles remaining therein resulted in a difference in shrinkage from the surrounding portion when fired, and peel-off occurred in the stacking surface of the green ceramic stack 101 after firing.

In sample No. 3 made as Comparative Example, the liquid jet 107 which was constituted from liquid only without abrasive particles had very low cutting power and was unable to cut off the green ceramic stack 101.

In the multi-layer piezoelectric actuators of sample No. 1 of the present invention, in contrast, since the liquid jet 107 which contained the abrasive material comprising ceramic particles of the same material as the ceramic layer constituting the green ceramic stack 101 was used, abrasive particles having composition containing the main component different from that of the ceramic layer did not mix in, and crack and peel-off did not occur in the green ceramic stack 101 after firing.

Example 3

In Example 3, the green ceramic stack 101 of the present invention made by the method described above was cut, to investigate the effect of the particle size of the abrasive particles contained in the liquid jet 107 on the cutting performance.

The green ceramic stack 101 was cut with the liquid jet 107 which contained abrasive particles of the same material as the ceramic layer, with mean particle size controlled in a range from 5 to 700 μm.

Cutting performance of the samples described above was evaluated by measuring the surface roughness (Ra) of the cut surface after firing, and sample which showed surface roughness (Ra) of 1 μm or less was rated as "GOOD", and sample which showed Ra exceeding 1 μm was rated as "BAD". The results are shown in Table 4.

TABLE 4

| Sample No. | Abrasive particle | Mean particle size of abrasive particles (μm) | Cutting | Surface roughness (Ra) of cut surface |
|---|---|---|---|---|
| 1 | Same ceramics | 5 | BAD | — |
| 2 | Same ceramics | 10 | GOOD | GOOD |
| 3 | Same ceramics | 30 | GOOD | GOOD |
| 4 | Same ceramics | 50 | GOOD | GOOD |
| 5 | Same ceramics | 100 | GOOD | GOOD |
| 6 | Same ceramics | 200 | GOOD | GOOD |
| 7 | Same ceramics | 500 | GOOD | GOOD |
| 8 | Same ceramics | 700 | ORDINARY | ORDINARY |

From Table 4, it can be seen that in sample No. 1, since mean particle size of the abrasive particles was small, grinding power of the liquid jet 107 decreased as the portion of the abrasive particle which made contact with the green ceramic stack 101 during cutting became narrower, thus making it unable to cut the green ceramic stack 101.

In sample No. 8, since mean particle size of the abrasive particles was large, flow velocity of the liquid jet 107 discharged from the nozzle 106 became too slow to maintain the straight stream of the liquid jet 107. As a result, cut surface became rough and the green ceramic stack 101 could not be cut with high accuracy.

In the multi-layer piezoelectric actuators of samples Nos. 2 through 7, in contrast, since the abrasive particles having mean particle size in a range from 10 to 500 μm were used, the green ceramic stack 101 was cut with high accuracy satisfactorily with high cutting performance and smooth cut surface. Thus mean particle size of the abrasive particles comprising ceramic particles of the same material as the ceramic layer constituting the green ceramic stack 101 is preferably in a range from 10 to 500 μm.

Example 4

In Example 4, the green ceramic stack 101 of the present invention made by the method described above was evaluated for electrical conductivity of the liquid of the liquid jet 107, impurity mixing in during cutting and the conditions of the cut surface of the green ceramic stack 101 after firing.

The green ceramic stack 101 was cut with different kinds of liquid jet 107, one using tap water having electrical conductivity exceeding 1.0 μS/cm and one using pure water having electrical conductivity of 1.0 μS/cm or less.

Entry of impurities and the condition of the cut surface of the green ceramic stack 101 which was cut as described above were evaluated. The cut surface of the green ceramic stack 101 was observed under a binocular microscope to determine the existence of particles of different composition and the presence of crack and peel-off. The results are shown in Table 5.

TABLE 5

| Sample No. | Abrasive particle | Electrical conductivity of (μS/cm) | Entry of impurity | Crack, peel-off |
|---|---|---|---|---|
| 1 | Same ceramics | >1.0 | BAD Present | BAD Present |
| 2 | Same ceramics | ≦1.0 | GOOD, None | GOOD, None |

Entry of impurity in Table 5 means mixing of impurity in the ceramic stack.

From Table 5, it can be seen that in sample No. 1, since tap water having electrical conductivity exceeding 1.0 μS/cm was used, the liquid jet 107 contained much electrolyte and the electrolyte entered the cut surface as an impurity when cutting the green ceramic stack 101, thus resulting in a difference in shrinkage, cracks and peel-off in the green ceramic stack 101 after firing.

In sample No. 2 where pure water having electrical conductivity of 1.0 μS/cm or less was used, in contrast, the electrolyte did not enter the cut surface in a large quantity as an impurity, and therefore cracks and peel-off did not occur in the green ceramic stack 101 after firing. Thus it is preferable to use the liquid jet 107 constituted from water having electrical conductivity of 1.0 μS/cm or less.

Example 5

In Example 5, the green ceramic stack 101 of the present invention made by the method described above was tested to examine the dependency of cutting performance on the distance t between the jet nozzle 106 and the green ceramic stack 101, discharge pressure of the liquid jet 107 and the quantity of the abrasive particles supplied from the jet nozzle 106. Cutting performance of the samples described below was evaluated by measuring the surface roughness (Ra) of the cut surface after firing. Sample which showed surface roughness (Ra) of 1 μm or less was rated as "GOOD", and sample which showed Ra exceeding 1 μm was rated as "BAD".

Distance t between the jet nozzle 106 and the green ceramic stack 101 was changed in a range from 0.1 to 4.0 mm, and the green ceramic stack 101 was cut. The results are shown in Table 6.

TABLE 6

| Sample No. | Abrasive particle | Distance between jet nozzle and green ceramic stack (mm) | Cutting | Surface roughness (Ra) of cut surface |
|---|---|---|---|---|
| 1 | Same ceramics | 0.1 | GOOD | GOOD |
| 2 | Same ceramics | 0.5 | GOOD | GOOD |
| 3 | Same ceramics | 1.0 | GOOD | GOOD |
| 4 | Same ceramics | 2.0 | GOOD | GOOD |
| 5 | Same ceramics | 3.0 | GOOD | GOOD |
| 6 | Same ceramics | 4.0 | ORDINARY | ORDINARY |

From Table 6, it can be seen that in sample No. 6, since distance t between the jet nozzle 106 and the green ceramic stack 101 was large, the liquid jet 107 diffused significantly and cutting power decreased. As a result, as the width of cut at the top surface of the green ceramic stack became large, failure of cutting occurred at the bottom of the green ceramic stack 101.

When the distance t is 0.1 mm or less, since variability in the thickness due to technical factor in forming the green ceramic stack 101 occurs in the stacking surface of the green ceramic stack 101, the nozzle 106 touches a high point of the surface of the green ceramic stack 101 caused by the fluctuation in thickness of the green ceramic stack 101, and therefore the distance t could not be set to 0.1 mm or less.

In samples Nos. 2 through 5, in contrast, since distance t between the jet nozzle 106 and the green ceramic stack 101 was set within a range from 0.1 to 4.0 mm, it was enabled to suppress the liquid jet 107 from diffusing, thus making it possible to cut the green ceramic stack 101 without having the grinding power of the liquid jet 107 decreasing. Accordingly, distance t between the jet nozzle 106 and the green ceramic stack 101 is preferably in a range from 0.1 to 4.0 mm.

Then the green ceramic stack 101 was cut while changing the pressure of discharging the liquid jet 107 in a range from 50 to 500 MPa. The results are shown in Table 7.

TABLE 7

| Sample No. | Abrasive particles | Discharge pressure (MPa) | Cutting | Surface roughness (Ra) of cut surface |
|---|---|---|---|---|
| 1 | Same ceramics | 50 | ORDINARY | ORDINARY |
| 2 | Same ceramics | 100 | GOOD | GOOD |
| 3 | Same ceramics | 200 | GOOD | GOOD |
| 4 | Same ceramics | 300 | GOOD | GOOD |
| 5 | Same ceramics | 400 | GOOD | GOOD |
| 6 | Same ceramics | 500 | GOOD | ORDINARY |

From Table 7, it can be seen that in sample No. 1, since the pressure of discharging the liquid jet 107 was low, grinding power was low and failure of cutting occurred at the bottom of the green ceramic stack 101.

In sample No. 6, since the pressure of discharging the liquid jet 107 was high, grinding power of the liquid jet 107 was high and lumps of ground powder generated from the green ceramic stack 101 during cutting grew in size. As a result, cutting the green ceramic stack with the liquid jet 107 which contained the ground powder resulted in uneven cut surface and rough cut surface, thus requiring additional machining process after firing.

In samples Nos. 2 through 5, in contrast, as the pressure of discharging the liquid jet 107 was set in a range from 100 to 400 MPa, the grinding power was enough to cut the green ceramic stack 101 and the cutting operation was not impeded by the ground powder, thus cutting the green ceramic stack 101 having smooth cut surface. Accordingly, it is preferable to set the pressure of discharging the liquid jet 107 in a range from 100 to 400 MPa.

Then the green ceramic stack 101 was cut while changing the quantity of the abrasive particles supplied from the jet nozzle 106 in a range from 50 to 500 g/minute. The results are shown in Table 8.

TABLE 8

| Sample No. | Abrasive particles | Quantity of abrasive particles (g/minute) | Cutting | Surface roughness (Ra) of cut surface |
|---|---|---|---|---|
| 1 | Same ceramics | 50 | ORDINARY | — |
| 2 | Same ceramics | 100 | GOOD | GOOD |
| 3 | Same ceramics | 200 | GOOD | GOOD |
| 4 | Same ceramics | 300 | GOOD | GOOD |
| 5 | Same ceramics | 400 | GOOD | GOOD |
| 6 | Same ceramics | 500 | GOOD | ORDINARY |

From Table 8, it can be seen that in sample No. 1, since the quantity of the abrasive particles was small, grinding power of the liquid jet 107 decreased as the portion of the abrasive particle which makes contact with the green ceramic stack became narrower, thus causing failure of cutting at the bottom of the green ceramic stack 101.

In sample No. 6, since the quantity of the abrasive particles was large, flow velocity of the liquid jet 107 discharged from the nozzle 106 became too slow to maintain the straight stream of the liquid jet 107. As a result, cut surface became rough and the green ceramic stack 101 could not be cut with high accuracy.

In samples Nos. 2 through 5, in contrast, as the quantity of the abrasive particles supplied from the jet nozzle 106 was set in a range from 100 to 400 g/minute, the liquid jet had enough grinding power to cut the green ceramic stack 101 and maintained straight stream of the liquid jet 107, and was able to cut the green ceramic stack 101 with high accuracy.

Example 6

With the green ceramic stack 101 of the present invention made by the method described above, it was verified how the cutting performance depended on the presence of the drain grooves 102 formed in lattice configuration in the grinding machine 103 where the green ceramic stack 101 was to be placed for cutting.

The green ceramic stack 101 was cut by placing the green ceramic stack 101 on the grinding machine 103 having the drain grooves 102 formed in lattice configuration thereon.

Cutting performance of the samples described above was evaluated by measuring the surface roughness (Ra) of the cut surface after firing, and sample which showed surface roughness (Ra) of 1 µm or less was rated as "GOOD", and sample which showed Ra exceeding 1 µm was rated as "BAD". The results are shown in Table 9.

TABLE 9

| Sample No. | Abrasive particle | Drain groove | Cutting | Surface roughness (Ra) of cut surface |
|---|---|---|---|---|
| 1 | Same ceramics | BAD None | GOOD | ORDINARY |
| 2 | Same ceramics | GOOD Present | GOOD | GOOD |

From Table 9, it can be seen that in sample No. 1 in which case the grinding machine 103 did not have the drain grooves 102 formed in lattice configuration thereon, the liquid jet 107 which was discharged from the jet nozzle 106 and cut the green ceramic stack 101 bounced off the grinding machine 103, so that the liquid jet 107 was deviated from straight flowing direction due to collision of the liquid jet 107 bouncing off and the forward liquid jet 107. As a result, the cut surface became rough and the green ceramic stack 101 could not be cut with high accuracy.

In sample No. 2, in contrast, since the grinding machine 103 had the drain grooves 102 formed in lattice configuration, the liquid jet 107 which had cut the green ceramic stack 101 was drained through the drain grooves 102 of lattice configuration without bouncing off the grinding machine 103, so that the liquid jet 107 was able to maintain straight flowing direction, not affected by the collision of the liquid jet 107 bouncing off and the forward liquid jet 107, thus enabling it to cut the green ceramic stack 101 with high accuracy. Thus it is preferable that the drain grooves 102 are formed in lattice configuration in the grinding machine 103 where the green ceramic stack 101 is to be placed when cutting.

The invention claimed is:

1. A method for manufacturing a multi-layer piezoelectric element comprising:
   a step of forming a stack from at least one piezoelectric layer and a plurality of internal electrodes stacked one on another;
   a step of grinding at least two side faces of the stack, thereby forming one or more cracks on the two side faces; and
   a step of applying an electrically conductive paste containing 1% by weight or more glass onto the two side faces and firing the stack at a temperature that is higher than the softening point of the glass and causes the electrically conductive paste that has been applied to shrink by 10% or more in the direction of thickness, thereby forming the external electrodes.

2. The method for manufacturing a multi-layer piezoelectric element, according to claim 1,
wherein the step of forming the stack comprises a step of preparing a green ceramic stack by stacking green ceramic layers containing the material of the piezoelectric layer and electrically conductive layers containing the material of the internal electrode one on another, a step of cutting the green ceramic stack by applying a jet of liquid, which contains an abrasive material comprising ceramic particles of the substantially the same material as the ceramic particles constituting the green ceramic layer, from a jet nozzle to the green ceramic stack, and a step of firing the green ceramic stack which has been cut so as to obtain the stack.

3. The method for manufacturing the multi-layer piezoelectric element according to claim 1, wherein mean particle size of the abrasive material comprising ceramic particles is in a range from 10 to 500 μm.

4. The method for manufacturing the multi-layer piezoelectric element according to claim 1 wherein the liquid constituting the liquid jet has electrical conductivity of 1.0 μS/cm or less.

5. The method for manufacturing the multi-layer piezoelectric element according to claim 1, wherein the discharge pressure for the liquid jet is set in a range from 100 to 400 MPa.

6. The method for manufacturing the multi-layer piezoelectric element according to claim 1, wherein the jet nozzles in plurality are provided so as to be able to cut along a plurality of lines at the same time.

7. The method for manufacturing the multi-layer piezoelectric element according to claim 1, wherein the green ceramic stack is cut on a grinding machine which has drain grooves formed in lattice configuration.

8. The method for manufacturing the multi-layer piezoelectric element according to claim 1, wherein the stack is ground using a grinding wheel having a grain size coarser than #6000 in the grinding step.

* * * * *